(12) United States Patent
Doran

(10) Patent No.: US 8,662,639 B2
(45) Date of Patent: Mar. 4, 2014

(54) FLEXIBLE CIRCUIT

(76) Inventor: John A. Doran, Leinster (IE)

( * ) Notice: Subject to any disclaimer, the term of this patent is extended or adjusted under 35 U.S.C. 154(b) by 218 days.

(21) Appl. No.: 13/192,338

(22) Filed: Jul. 27, 2011

(65) Prior Publication Data

US 2011/0279986 A1   Nov. 17, 2011

Related U.S. Application Data

(63) Continuation of application No. PCT/US2009/032758, filed on Jan. 30, 2009.

(51) Int. Cl.
*B41J 2/14* (2006.01)
*B41J 2/16* (2006.01)

(52) U.S. Cl.
USPC .............................................. 347/50; 347/58

(58) Field of Classification Search
USPC .................... 347/20, 49, 50, 56–59
See application file for complete search history.

(56) References Cited

U.S. PATENT DOCUMENTS

| | | | |
|---|---|---|---|
| 4,434,430 A | 2/1984 | Koto | |
| 4,878,070 A | 10/1989 | Watrobski | |
| 5,045,870 A | 9/1991 | Lamey et al. | |
| 5,589,859 A | 12/1996 | Schantz | |
| 5,953,032 A | 9/1999 | Haarz et al. | |
| 6,174,046 B1 * | 1/2001 | Reid et al. | 347/50 |
| 6,357,864 B1 | 3/2002 | Sullivan et al. | |
| 6,372,992 B1 | 4/2002 | Yang | |
| 6,866,368 B2 | 3/2005 | Leu et al. | |
| 7,279,216 B2 | 10/2007 | Chen et al. | |
| 7,419,246 B2 | 9/2008 | Malpica | |

FOREIGN PATENT DOCUMENTS

| | | |
|---|---|---|
| GB | 2440840 A | 2/2008 |
| WO | WO 02/100952 A2 | 12/2002 |
| WO | WO 2007/027604 A1 | 3/2007 |

OTHER PUBLICATIONS

MINCO, Products—Flex Circuits, http://www.minco.com/products/flex.aspx?id=1180, Jan. 15, 2009.
3M, Microinterconnect Solutions, http://solutions.3m.com/wps/portal/3M/en_WW/electronics/home/productsandservices/pro, Jan. 15, 2009.
Flexibelcircuit Technologies, Inc.,Flexible Printed Circuits, http://www.flexiblecircuit.com/products/flex-printed/, Jan. 15, 2009.

* cited by examiner

*Primary Examiner* — Juanita D Jackson

(57) ABSTRACT

A flexible circuit includes a sprocket opening and electrically conductive lines connected to a print head.

20 Claims, 6 Drawing Sheets

FLEXIBLE CIRCUIT

CROSS-REFERENCE TO RELATED PATENT APPLICATIONS

The present application is a continuation of co-pending PCT/US09/32758 filed on Jan. 30, 2009 by John A. Doran and entitled FLEXIBLE CIRCUIT, the full disclosure of which is hereby incorporated by reference.

BACKGROUND

During fabrication, flexible circuits are sometimes transported and positioned using sprocket openings. Upon fabrication completion, those portions of the flexible circuit containing the sprocket openings are severed and discarded. The discarded portions containing the sprocket openings constitute waste and increase cost.

DETAILED DESCRIPTION OF THE EXAMPLE EMBODIMENTS

Figure 1:
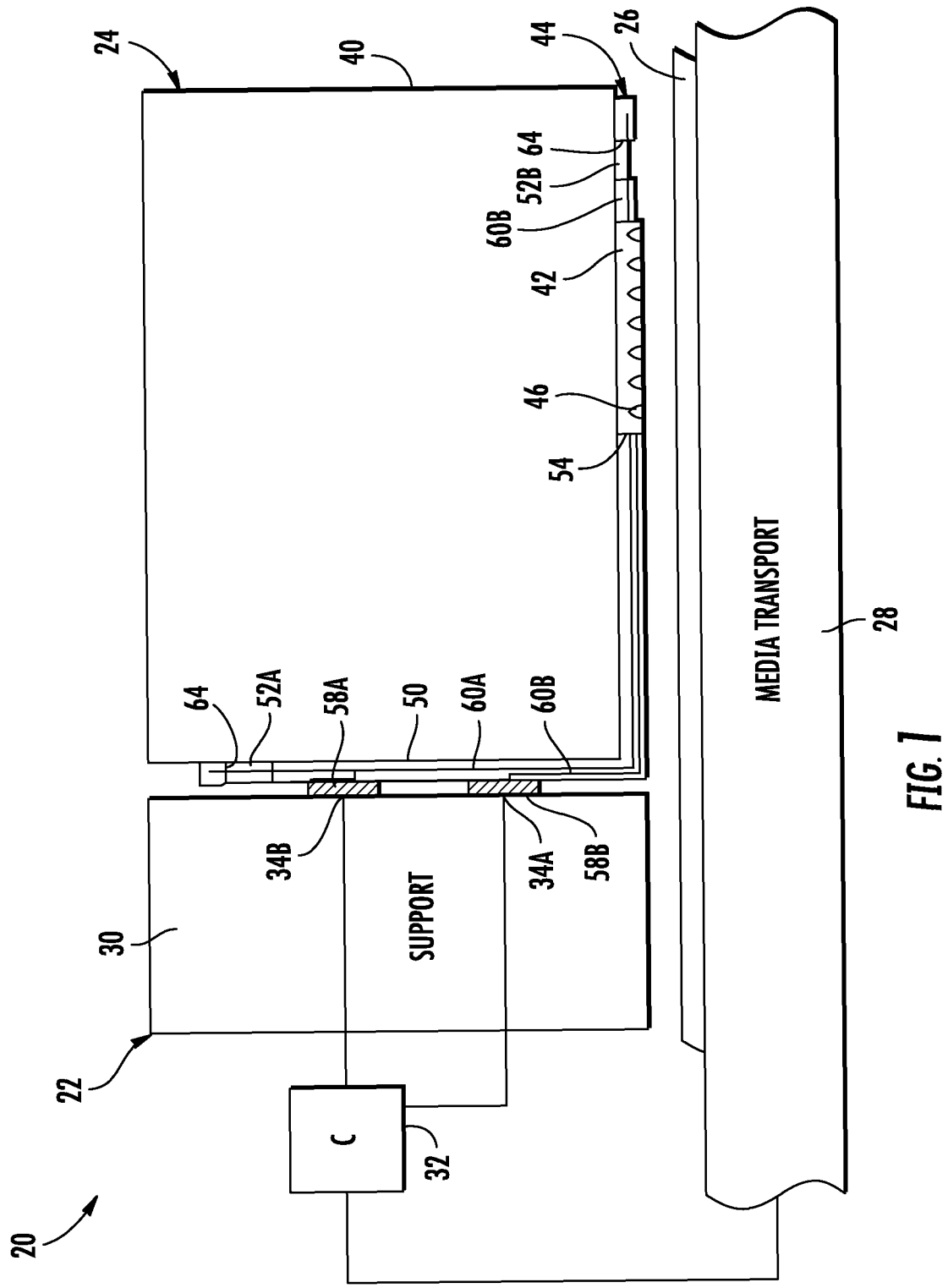
FIG. 1 is a schematic illustration of a printing system including a print cartridge employing a flexible circuit according to an example embodiment.

FIG. 1 schematically illustrates marking or printing system 20 according to one example embodiments. As will be described in detail hereafter, printing system 20 communicates with one or more print heads using a flexible circuit having a layout of electrically conductive lines (sometimes referred to as traces) that accommodate sprocket openings in the flexible circuit. Because the layout of electrically conductive lines accommodate sprocket openings in the flexible circuit, portions of the flexible circuit do not need to be severed and discarded prior to connection to the one more print heads, reducing waste. In addition, the flexible circuit may have a greater density of electrically conductive lines, contact pads and other components.

As shown by FIG. 1, printing system 20 includes printer 22 and pen, marking device or print cartridge 24. Printer 22 comprises a device configured to selectively deliver printing material, such as a fluid or ink, supplied by print cartridge 24, to a print medium 26. Printer 22, schematically illustrated, includes media transport 28, support 30 and controller 32. Media transport 28 comprises a mechanism configured to transport and position print media 26 opposite to print cartridge 24 for marking or printing. In one embodiment, media transport 28 comprises one or more belts, rollers and the like. In other embodiments, media transport 28 may have other configurations. For example, although media transport 28 is illustrated as supporting print media 26 in a substantially horizontal orientation, in other embodiments, media transport 28 may alternatively support print media 26 in a vertical or inclined orientation.

Support 30 comprises one or more structures or mechanisms configured to support and position print cartridge 24 substantially opposite to print media 26 being supported by media transport 28. In one embodiment, support 30 is configured to be releasably connected to print cartridge 24, allowing print cartridge 24 to be removed and replaced as needed. In other embodiments, support 30 may be permanently connected to or joined to print cartridge 24. In one embodiment, support 30 may comprise a stationary structure such as in those embodiments wherein print cartridge 24 itself spans a dimension of print media 26 (such as in a page wide array printer) or wherein print cartridge 24 in combination with other print cartridges 24 collectively span a dimension of print media 26. In yet other embodiments, support 30 may comprise a carriage configured to be reciprocatively driven across print media 26 to scan print cartridge 24 across print media 26. As schematically shown by FIG. 1, support 30 includes one or more electrical contacts 34A and 34B (collectively referred to as contacts 34) configured to make electrical contact with print cartridge 24 to facilitate communication of electrical signals representing data or instructions between controller 32 and print cartridge 24.

Controller 32 comprise one or more processing units configured to generate control signals directing or controlling the marking or printing of printing material onto print media 26 by cartridge 24. In one embodiment, controller 32 may additionally generate control signals directing the positioning of print media 26 by media transport 28. For purposes of this application, the term "processing unit" shall mean a presently developed or future developed processing unit that executes sequences of instructions contained in a memory. Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other embodiments, hard wired circuitry may be used in place of or in combination with software instructions to implement the functions described. For example, controller 32 may be embodied as part of one or more application-specific integrated circuits (ASICs). Unless otherwise specifically noted, the controller is not limited to any specific combination of hardware circuitry and software, nor to any particular source for the instructions executed by the processing unit.

Print cartridge 24 comprises a mechanism configured to supply and deposit printing material, such as a fluid or ink, onto media transport 26 in response to control signals from controller 32. In one embodiment, print cartridge 24 is configured to be removably or releasably connected to support 30 by one or more latching mechanisms, clips and the like. In another embodiment, print cartridge 24 may be connected to support 30 in a more permanent fashion. Print cartridge 24 includes fluid supply 40, print head 42 and flexible circuit 44.

Fluid supply 40 comprises one more structures configured to form a container for storing a printing material, fluid or ink. In one embodiment, fluid supply 40 provides a self-contained supply of marking liquid or ink, wherein print cartridge 24 is disposed of or disconnected from support 30 and refilled upon substantial exhaustion of the liquid within the container of supply 40. In another embodiment, supply 40 may itself be connected to an additional external supply or source of marking liquid or ink, such as with an off-axis liquid or ink supply.

Print head 42 comprises a device configured to mark, print or deposit marking material, liquid or ink, supplied by supply 40, onto print media 26 in response to control signals from controller 32. Print head 42 is coupled to or mounted to fluid supply 40. In one embodiment, print head 42 includes a plurality of nozzles 46 (schematically shown) which eject or fire droplets of printing liquid or ink onto print media 26 in response to control signals from controller 32. In one embodiment, print head 42 may comprise a thermoresistive drop-on-demand print head. In another embodiment, print head 42 may comprise a piezo resistive drop-on-demand print head. In yet other embodiments, print head 42 may comprise other devices configured to selectively apply a printing material in response to control signals received from controller 32. Although print cartridge 24 is illustrated as having a single fluid supply 40 and a single print head 42, in other embodiments, print cartridge 24 may have multiple fluid supplies 40 and multiple print heads 42, wherein at least some of the fluid supplies 40 and print heads 42 apply different colors of marking liquid or ink or different liquids having different characteristics in response to control signals from controller 32.

Flexible circuit 44 transmits the aforementioned electrical control signals from controller 32 to print head 42. Flexible circuit 44 (schematically shown in section and enlarged for purposes of illustration) is coupled to fluid supply 40 so as to the carried by print cartridge 24 and so as to remain with print cartridge 24 upon removal or disconnection of print cartridge 24 from printer 22. Flexible circuit 44 generally extends from support 30 to print head 42 along an exterior of the body or fluid supply 40 of print cartridge 24. Flexible circuit 44 includes flexible encasement or substrate 50, sprocket openings 52A, 52B (collectively referred to as sprocket openings 52), print head window 54, contact pads 58A, 58B (collectively referred to as contact pads 58) and electrically conductive circuitry, traces or lines 60A, 60B (collectively referred to as electrically conductive lines 60).

Flexible encasement or substrate 50 comprises one or more layers of dielectric material supporting electrically conductive lines 60 and contact pad 58. In one embodiment, substrate 50 encapsulates electrically conductive lines 60, wherein contact pads 58 project through substrate 50 for electrical contact with contacts 34 of support 30. In one embodiment, the dielectric material of substrate 50 has a thickness and is formed from a material is to be bendable or flexible such that flexible circuit 44 may be wrapped around different sides or faces of fluid supply 40 of print cartridge 24. For example, in the embodiment shown, flexible circuit 44 is sufficiently flexible so as to be wrapped around two sides or faces which are at approximately 90 degrees. In one embodiment, substrate 50 comprises a flexible dielectric material such as one or more flexible or bendable polymers. In one embodiment, the polymeric encasement of substrate 50 comprises one or more polyamides.

Sprocket openings 52 comprise holes or apertures extending completely through substrate 50 and through flexible circuit 44. In the example illustrated, sprocket openings 52 are located at opposite longitudinal ends of substrate 50 and of flexible circuit 44. Although flexible circuit 44 is illustrated as including a single sprocket opening 52 at each longitudinal end, in other embodiments, flexible circuit 44 may include two or more sprocket openings 52 at each longitudinal end or at intermediate portions of flexible circuit 44. Sprocket openings 52 are configured to receive sprocket teeth during the manufacture or fabrication of flexible circuit 44. Sprocket openings 52 facilitate the transport and positioning of one or more flexible circuits 44, individually or as part of a web, as other structures of flexible circuit 44 are formed. In particular, sprocket openings 52 facilitate precise positioning of flexible circuit 44 as contact pads 58, electrically conductive lines 60 and print head window 54 are formed. In embodiments where electrically conductive lines 60 and/or contact pads 58 are at least partially formed using electroplating, sprocket openings 52 further facilitate the application of electrical current by the sprocket teeth to perform such electroplating.

Print head window 54 comprises an opening through flexible circuit 44 configured to receive or extend at least partially opposite to print head 42 (or multiple print heads 42) to expose print head 42. Window 54 continuously and completely encircles print head 42. In other embodiments, window 46 may alternatively partially encircle or extend about print head 42. In one embodiment, window 54 may be omitted, wherein flexible circuit 44 extends to and along a single side of print head 46. In embodiments where print cartridge 24 includes multiple print heads 42, flexible circuit 44 may include multiple windows 54.

Contact pads 58 comprise pads of electrically conductive material or materials exposed through substrate 50 and configured to make electrical contact with contacts 34 of support 30. Contact pads 58 are in electrical contact with electrically conductive lines 60. Although flexible circuit 44 is illustrated as having two contact pads 58, in other embodiments, flexible circuit 44 may include greater than two contact pads 58 configured to make electrical contact with different or distinct contacts 34 of support 30. Such multiple contact pads 58 are electrically isolated from one another and facilitate control of distinct nozzles 46 of print head 42 by controller 32. Although not illustrated, in some embodiments, flexible circuit 44 may include additional contact pads 58 which are not electrically connected to print head 42 and which are electrically isolated from those contact pads 58 which are electrically connected to print head 42. Such contact pads 58 (sometimes referred to as dummy contact pads or floating pads) facilitate an even or desired distribution of force at the interface between print cartridge 24 and support 30. Such dummy contact pads facilitate use of print cartridge 24 with different printers 22.

Electrically conductive circuits or lines 60 extend from contact pads 58 to print head 42. In the embodiment illustrated, electrically conductive lines 60 extend adjacent to an inside edge 64 of each of sprocket openings 52. As a result, electrically conductive lines 60 may make electrical contact with sprocket teeth which are electrically charged, enabling electrically conductive lines 60 to be further electroplated. For example, in one embodiment, electrically conductive lines 60 are formed from two layers. A first layer of the two layers is a metallic layer which is patterned onto a portion of substrate 50. In one embodiment, this first layer is copper. In other embodiments, the first layer may be formed from other metallic materials which may also subject to oxidation. To prevent or inhibit oxidation, a second metallic layer which is less susceptible to oxidation is electroplated on the first metallic layer. In one embodiment the second metallic layer comprises gold. The electroplating process by which the second metallic layer is formed on the first without layer is facilitated by extending electrically conductive lines 60 adjacent to an edge of sprocket openings 52.

To electroplate all portions of the first layer of electrically conductive lines 60, electrically conductive lines 60A and 60B are in electrical contact with an edge of at least one of sprocket openings 52. However, to electrically isolate electrically conductive line 60A from electrically conductive lines 60B, enabling electrically conductive line 60 to transmit different electrical signals from controller 32, electrically conductive line 60A and its associated contact pad 58A is electric isolated from electrically conductive line 60B and its associated contact pad 58B. In particular, electrically conductive line 60A extends adjacent to an inner edge 64 of sprocket openings 52A while electrically conductive line 60B extends adjacent to an inner edge 64 of sprocket openings 52B.

According to one embodiment, electrically conductive lines 60 completely encircle sprocket openings 52 and extend along substantially an entire perimeter of inner edge 64 of each of sprocket openings 52. As a result, a more reliable electrical connection with the sprocket teeth within sprocket openings 52 is achieved during electroplating of electrically conductive lines 60 and contact pads 58. As further shown by FIG. 1, when encircling sprocket openings 52, electrically conductive lines 60 are physically sandwiched between the closest sprocket openings 52 and a longitudinal end of the flexible circuit 44 or its substrate 50.

Overall, because sprocket openings 52 remain a part of flexible circuit 44 when flexible circuit 44 is in use, such as when it is mounted to print cartridge 24 and connected to print head 46, fabrication of flexible circuit 44 is simplified and results in less waste. Because two or more of sprocket openings 52 are in electrical contact with different electrical conductive lines 60, such electrically conductive lines 60 and their associated contact pad 58 may be electrically isolated from one another, but may still be provided with electric current through such sprocket openings 52 for electroplating. Because sprocket openings 52 remain as part of flexible circuit 44 and are not severed, sprocket openings 52 may be more compactly arranged with respect to print head window 54, contact pads 58 and electrically conductive lines 60, facilitating a more dense arrangement of such components.

Although electrically conductive lines 60A and 60B are illustrated as being electrically connected to an interior edge of sprocket openings 52A and 52B located on opposite longitudinal ends of flexible circuit 44, in other embodiments, electrically conductive lines 60A and 60B may alternatively be electrically connected to two distinct sprocket openings located proximate to the same longitudinal end of flexible circuit 44. Although flexible circuit 44 is illustrated as being employed with print cartridge 24, in other embodiments, flexible circuit 44 may be used another electronic component or electronic device. In such embodiments, print head window 54 may be omitted. In such embodiments, flexible circuit 44 may be mounted to and electrically connected to another type of electronic component while still retaining or including sprocket openings 52 utilized during the fabrication of flexible circuit 44.

Figure 2:
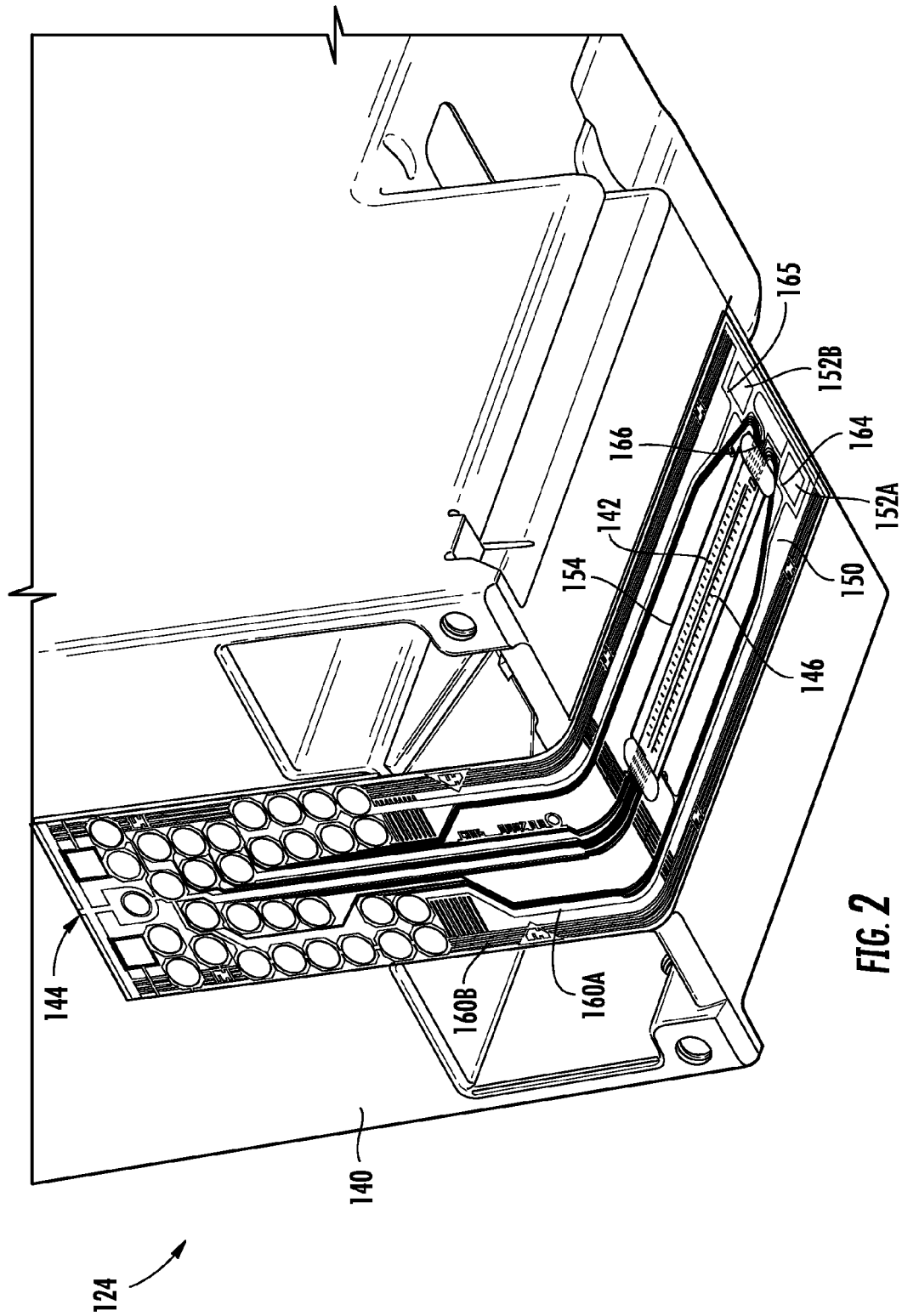
FIG. 2 is a perspective view of another embodiment of the print cartridge of FIG. 1 including another embodiment of the flexible circuit according to an example embodiment.

FIG. 2 illustrates print cartridge 124, a particular embodiment of print cartridge 24 shown in FIG. 1. Like print cartridge 24, print cartridge 124 comprises a mechanism configured to supply and deposit printing material, such as a fluid or ink, onto media 26 in response to control signals from controller 32 (shown FIG. 1). In one embodiment, print cartridge 124 is configured to be removably or releasably connected to support 30 by one or more latching mechanisms, clips and the like. In another embodiment, print cartridge 124 may be connected to support 30 in a more permanent fashion. Print cartridge 24 includes fluid supply 140, print head 142 and flexible circuit 144.

Fluid supply 140 comprises one more structures configured to form a container for storing a printing material, fluid or ink. In one embodiment, fluid supply 140 provides a self-contained supply of marking liquid or ink, wherein print cartridge 124 is disposed of or disconnected from support 30 (shown in FIG. 1) and refilled upon substantial exhaustion of the liquid within the container of supply 140. In another embodiment, supply 140 may itself be connected to an additional external supply or source of marking liquid or ink, such as with an off-axis liquid or ink supply.

Print head 142 comprises a device configured to mark, print or deposit marking material, liquid or ink, supplied by supply 140, onto print media 26 in response to control signals from controller 32 (shown in FIG. 1). Print head 142 is coupled to or mounted to fluid supply 140. In one embodiment, print head 142 includes a plurality of nozzles 146 which eject or fire droplets of printing liquid or ink onto print media 26 in response to control signals from controller 32. In one embodiment, print head 142 may comprise a thermoresistive drop-on-demand print head. In another embodiment, print head 142 may comprise a piezo resistive drop-on-demand print head. In yet other embodiments, print head 142 may comprise other devices configured to selectively apply a printing material in response to control signals received from controller 32. Although print cartridge 24 is illustrated as having a single fluid supply 140 and a single print head 142, in other embodiments, print cartridge 124 may have multiple fluid supplies 140 and multiple print heads 142, wherein at least some of the fluid supplies 140 and print heads 142 apply different colors of marking liquid or ink or different liquids having different characteristics in response to control signals from controller 32.

Flexible circuit 144 transmits the aforementioned electrical control signals from controller 32 (shown in FIG. 1) to print head 142. Flexible circuit 144 is coupled to fluid supply 40 so as to the carried by print cartridge 124 and so as to remain with print cartridge 124 upon removal or disconnection of print cartridge 124 from printer 22 (shown in FIG. 1). Flexible circuit 144 generally extends from support 30 to print head 142 along an exterior of the body or fluid supply 140 of print cartridge 124.

Figure 3A:
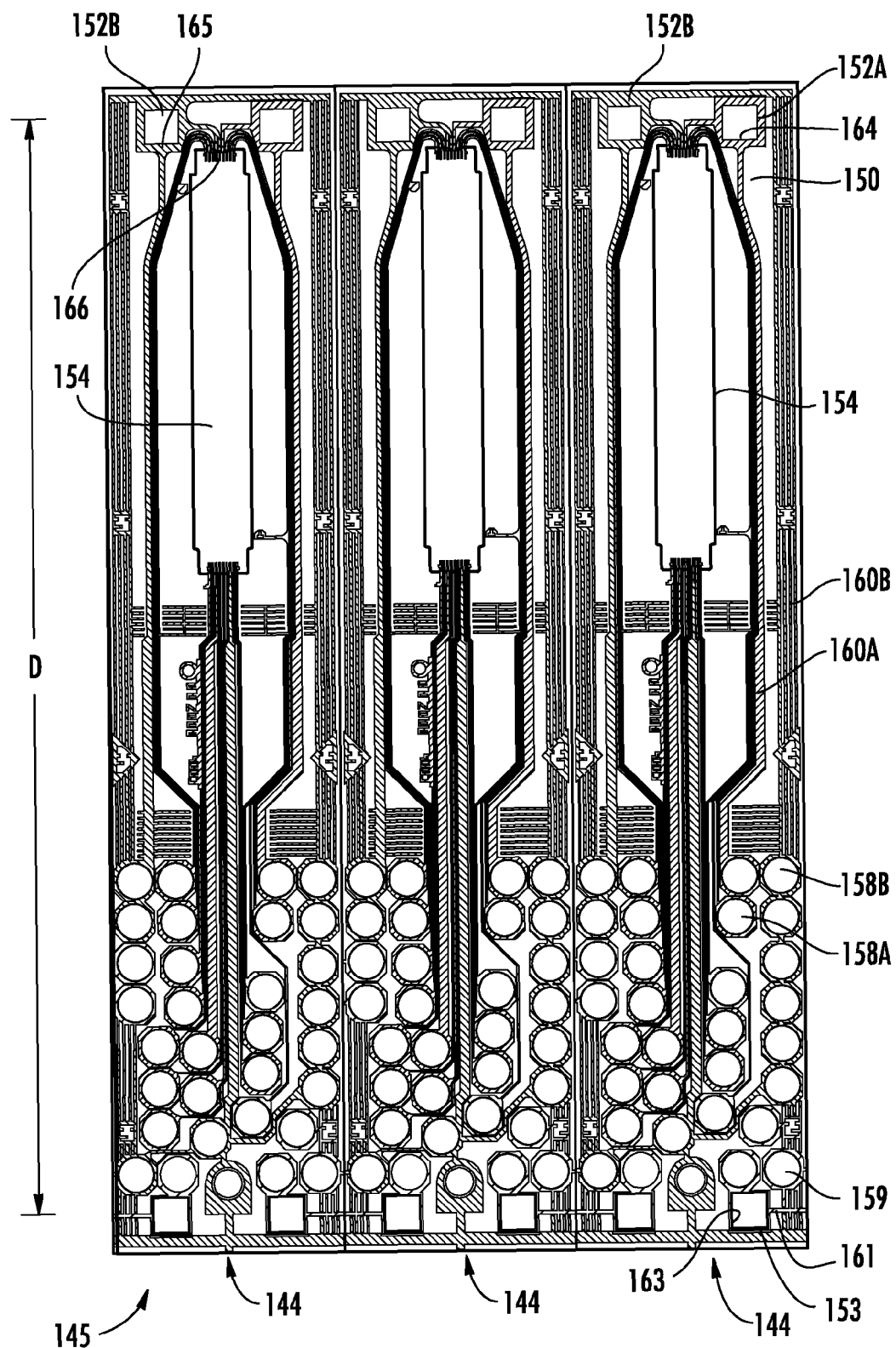
FIG. 3A is a top plan to view of a web of flexible circuits, including the flexible circuit of FIG. 2, according to an example embodiment.
Figure 3B:
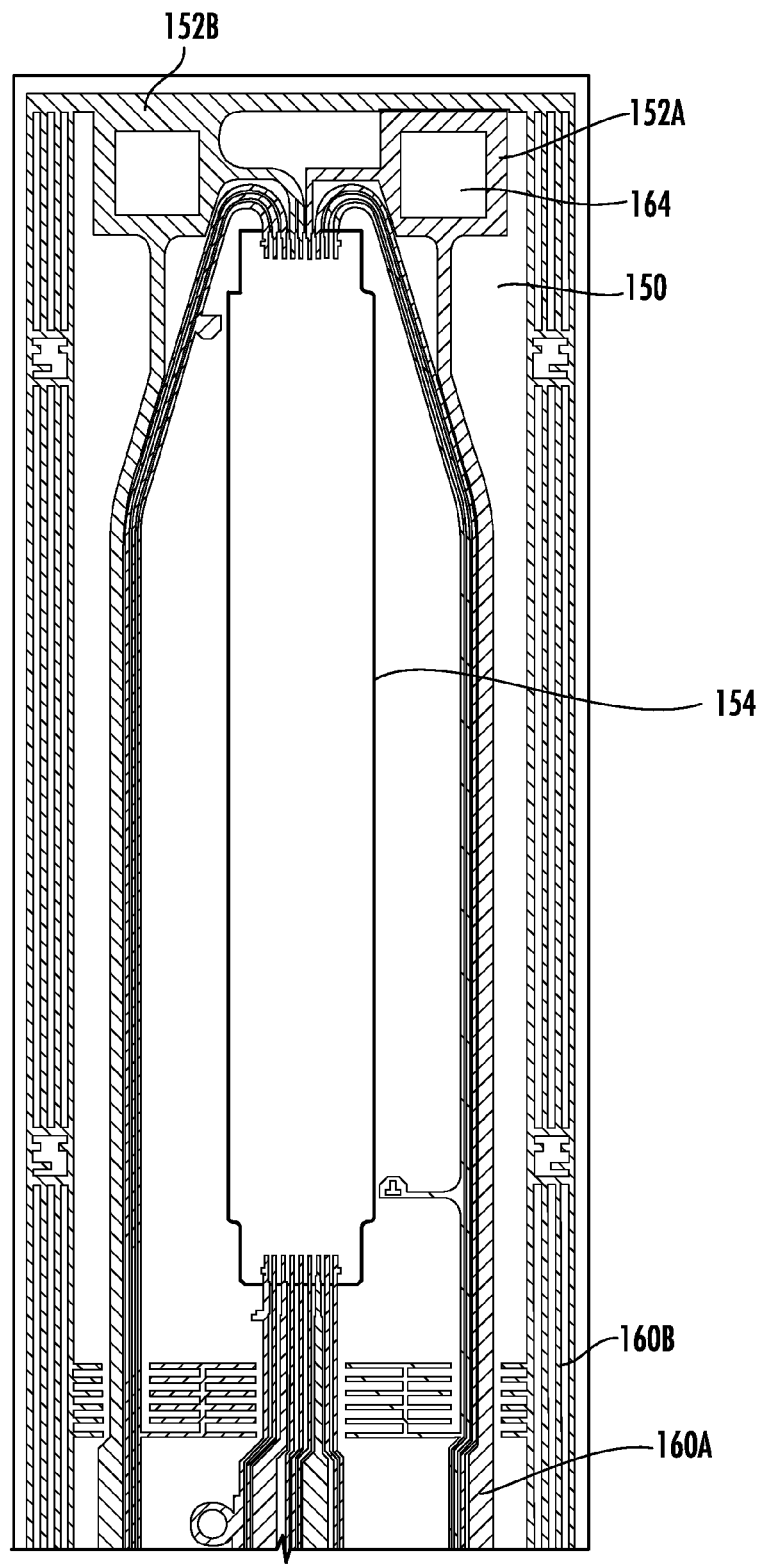
FIG. 3B is an enlarged top plan view of a first portion of the flexible circuit according to an example embodiment.
Figure 3C:
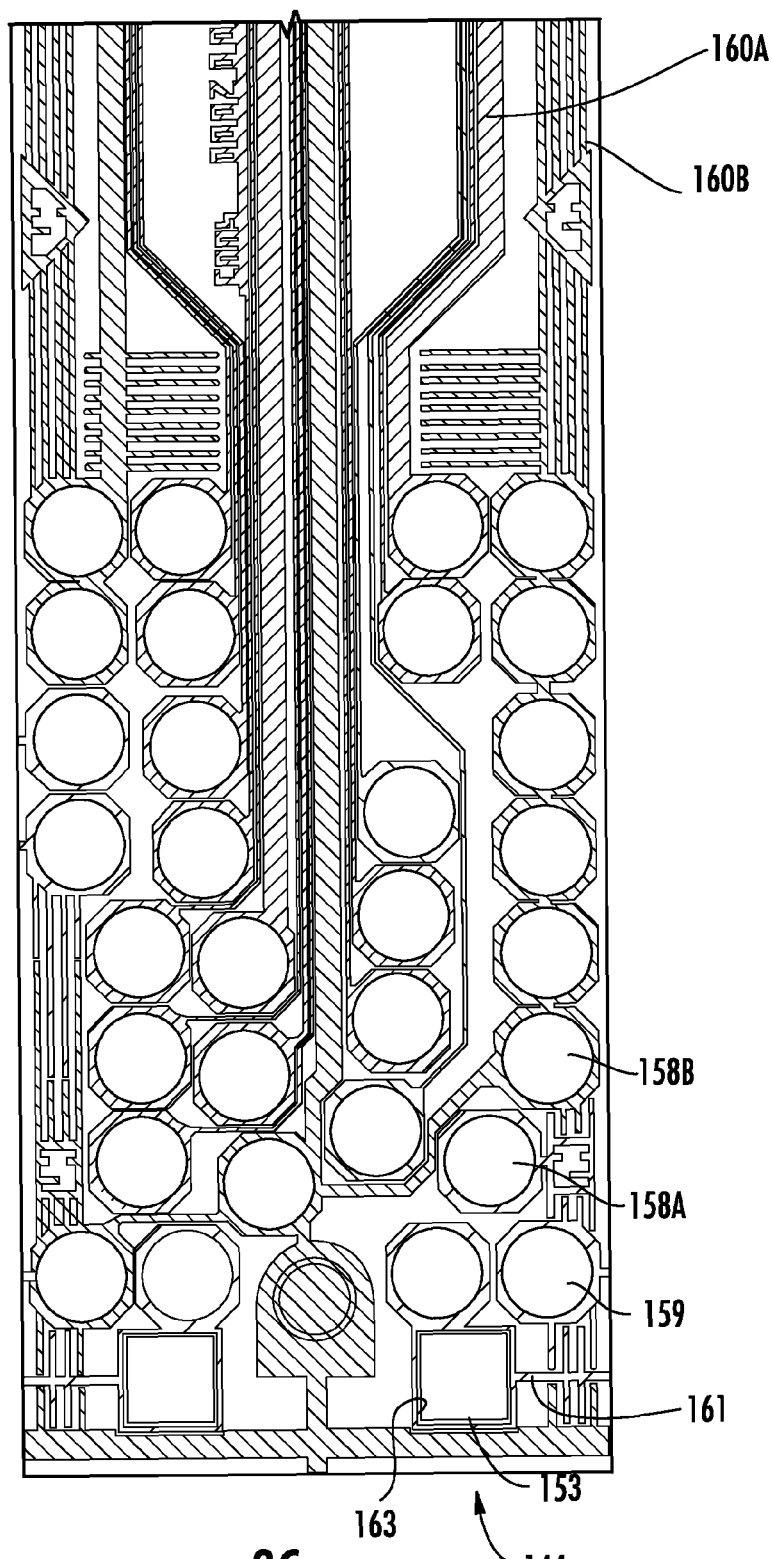
FIG. 3C is an enlarged top plan view of a second portion of the flexible circuit according to an example embodiment.
Figure 4:
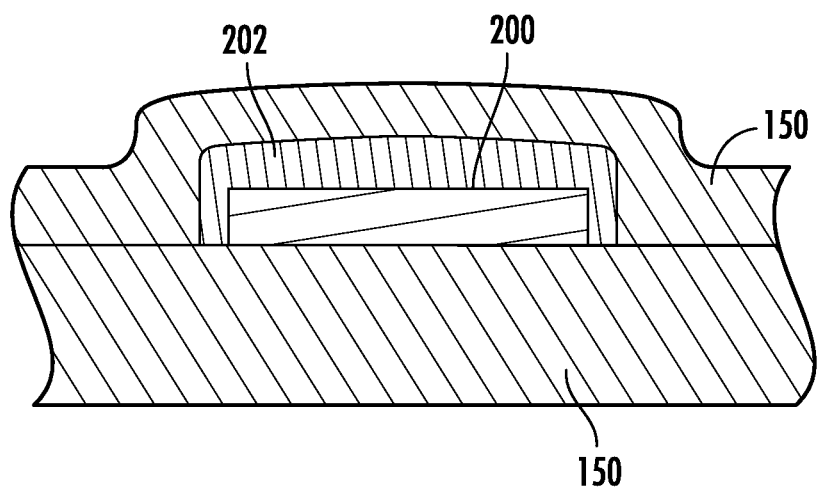
FIG. 4 is an enlarged fragmentary sectional view of the web of FIG. 3 taken along line 4-4 according to an example embodiment.

FIGS. 3 and 4 illustrate flexible circuit 144 in more detail. FIG. 3A is a top plan view of three flexible circuits 144 upon completion of the fabrication as part of a web 145 but prior to their separation from one another. FIGS. 3B and 3C are enlarged views of different portions of a single flexible circuit 44. In each of FIGS. 3A, 3B and 3C, different sectioning or hatching is used to identify and distinguish different electrically conductive lines or traces which are electrically isolated or distinct from one another and which transmit different electrical current or different signals. FIG. 4 is a sectional view taken along line 4-4 of FIG. 3. As shown by FIG. 3, flexible circuit 44 includes flexible encasement or substrate 150, sprocket openings 152A, 152B (collectively referred to as sprocket openings or sprocket holes 152), sprocket openings 153, print head window 154, active contact pads 158A, 158B (collectively referred to as contact pads 158), dummy contact pads 159, electrically conductive circuitry, traces or lines 160A, 160B (collectively referred to as electrically conductive lines 160) and electrically conductive circuitry, traces or lines 161.

Flexible encasement or substrate 150 comprises one or more layers of dielectric material supporting electrically conductive lines 160 and contact pads 158, 159. In one embodiment, substrate 150 encapsulates electrically conductive lines 160, wherein contact pads 158, 159 project through substrate 150 for electrical contact with contacts 34 of support 30 (shown in FIG. 1). In one embodiment, the dielectric material of substrate 150 has a thickness and is formed from a material so as to be bendable or flexible such that flexible circuit 144 may be wrapped around different sides or faces of fluid supply 140 of print cartridge 124. For example, in the embodiment shown, flexible circuit 144 is sufficiently flexible so as to be wrapped around two sides or faces which are at approximately 90 degrees. In one embodiment, substrate 150 comprises a flexible dielectric material such as one or more flexible or bendable polymers. In one embodiment, the polymeric encasement of substrate 150 comprises one or more polyamides.

Sprocket openings 152 and 153 comprise holes or apertures extending completely through substrate 150 and through flexible circuit 144. In the example illustrated, sprocket openings 152 and 153 are located at opposite longitudinal ends of substrate 150 and of flexible circuit 144. According to one embodiment, the center of sprocket opening 152 is longitudinally spaced from a center of sprocket opening 153 by a distance D selected from a group of distances consisting of 25 millimeters (mm), 48 mm and 70 mm (or other sizes). Although flexible circuit 144 is illustrated as including two sprocket openings 152, 153 at each longitudinal end, in other embodiments, flexible circuit 144 may include more sprocket openings 152, 153 at each longitudinal end or at intermediate portions of flexible circuit 144. Although illustrated as extending at ends of circuit 144, openings 152, 153 may alternatively be located anywhere along circuit 144. Sprocket openings 152, 153 are configured to receive sprocket teeth during the manufacture or fabrication of flexible circuit 144. Sprocket openings 152, 153 facilitate the transport and positioning of one or more flexible circuits 144 as other structures of flexible circuit 144 are formed. In particular, sprocket openings 152, 153 facilitate precise positioning of flexible circuit 44 as contact pads 158, 159, electrically conductive lines 160 and print head window 154 are formed. In embodiments where electrically conductive lines 160 and/or contact pads 158 are at least partially formed using electroplating, sprocket openings 152, 153 further facilitate the application of electrical current by the sprocket teeth to perform such electroplating.

Print head window 154 comprises an opening through flexible circuit 144 configured to receive or extend at least partially opposite to print head 142 (or multiple print heads 142) to expose print head 142. Window 154 continuously and completely encircles print head 142. In other embodiments, window 46 may alternatively only partially encircle or extend about print head 142. In one embodiment, window 154 may be omitted, wherein flexible circuit 144 extends to and along a single side of print head 146. In embodiments where print cartridge 124 includes multiple print heads 142, flexible circuit 144 may include multiple windows 154.

As further shown by FIG. 3, because sprocket openings 152 remain a part of flexible circuit 144 and do not need to be severed prior to use, sprocket openings 152 may be compactly arranged with respect to print head window 154. For example, edge 165 of sprocket opening 152B may be longitudinally spaced from the closest longitudinal edge 166 of window 154 by less than or equal to 3 mm. In some embodiments, edge 165 of windows 152 may extend between the two opposite longitudinal edges of window 154 such that openings 152, 153 and window 154 overlap one another. As a result, flexible circuit 144 may be provided with a more dense layout of circuitry and contact pads.

Contact pads 158 comprise pads of electrically conductive material or materials exposed through substrate 150 and configured to make electrical contact with contacts 34 of support 30 (shown in FIG. 1). Contact pads 158 are in electrical contact with electrically conductive lines 160. Contact pads 158 are electrically isolated from one another and facilitate control of distinct nozzles 146 of print head 142 by controller 32.

Dummy contact pads 159 are similar to contact pads 158 but are not electrically connected to print head 142. Contact pads 159 are electrically inactive during use of flexible circuit 144 and are electrically isolated from contact pads 158. Dummy contact pads 159 facilitate an even or desired distribution of force at the interface between print cartridge 124 and support 30 (shown in FIG. 1). Such dummy contact pads 159 facilitate use of print cartridge 124 with different printers 22.

Electrically conductive circuits or lines 160 extend from contact pads 158 to print head 142. In the embodiment illustrated, electrically conductive lines 160 extend adjacent to an inside edge 164 of each of sprocket openings 152. As a result, electrically conductive lines 160 may make electrical contact with sprocket teeth which are electrically charged, enabling electrically conductive lines 160 to be further electroplated. As shown by FIG. 4, electrically conductive lines 160 are formed from two layers. A first layer 200 of the two layers is a metallic layer which is patterned onto a portion of substrate 150. In one embodiment, this first layer 200 is copper. In other embodiments, the first layer may be formed from other metallic materials which may also subject to oxidation. To prevent or inhibit oxidation, a second metallic layer 202 which is less susceptible to oxidation is electroplated on the first metallic layer 200. In one embodiment the second metallic layer 202 comprises gold. The electroplating process by which the second metallic layer 202 is formed on the first layer 200 is facilitated by extending electrically conductive lines 160 adjacent to an edge of sprocket openings 152.

To electroplate all portions of the first layer of electrically conductive lines 160, electrically conductive lines 160A and 160B are in electrical contact with an edge of at least one of sprocket openings 152. However, to electrically isolate electrically conductive line 160A from electrically conductive lines 160B, enabling electrically conductive lines 160 to transmit different electrical signals from controller 32, electrically conductive line 160A and its associated contact pad 158A is electrically isolated from electrically conductive line 160B and its associated contact pad 158B. In particular, electrically conductive line 160A extends adjacent to an inner edge 164 of sprocket opening 152A while electrically conductive line 160B extends adjacent to an inner edge 164 of sprocket opening 152B.

According to one embodiment, electrically conductive lines 160 completely encircle sprocket openings 152 and extend along substantially an entire perimeter of inner edge 164 of each of sprocket openings 152. As a result, a more reliable electrical connection with the sprocket teeth within sprocket openings 152 is achieved during electroplating of electrically conductive lines 160 and contact pads 158. As further shown by FIG. 3, when encircling sprocket openings 152, electrically conductive lines 160 are physically sandwiched between the closest sprocket openings 152 and a longitudinal end of the flexible circuit 144 or its substrate 150.

Electrically conductive lines 161 are similar to electrically conductive lines 160 except that electrically conductive lines 161 are not electrically connected to print head 142. Rather, electrically conductive lines 161 are merely electrically connected between sprocket openings 153 and dummy contact pads 159. Electrically conductive lines 161 conduct electrical current from inner edge 64 of sprocket openings 153 to dummy contact pads 159 to facilitate electroplating of dummy contact pads 159. In one embodiment, electrically conductive lines 161 and contact pads 159 have a construction similar to that of both conductive lines 160 and contact pads 152. In particular, in one embodiment, electrically conductive lines 161 and contact pads 159 are formed from copper electroplated with gold. In the embodiment illustrated, electrically conductive lines 161 completely encircle sprocket openings 153 to provide enhanced electrical contact with sprocket teeth during fabrication of flexible circuit 144.

As further shown by FIG. 3, in some embodiments, electrically conductive lines 161 transversely extend across a boundary separating two side-by-side flexible circuits 144. As a result, electrical contact may be made from a sprocket opening 153 on one flexible circuit 144 to dummy contact pad 159 on an adjacent flexible circuit 144. Consequently, the dummy contact pad 159 on the adjacent flexible circle 144 may be electrically charged and may be electroplated even though the dummy contact pad 159 on the adjacent flexible circuit is not electrically connected to a sprocket opening 153 on the same flexible circuit 144. When the two consecutive or adjacent flexible circuits 144 are severed upon completion of fabrication of the multiple flexible circuits 144 as part of a web, this electrical connection is also severed. In other embodiments, the transverse extension of electrical conductive lines 161 across multiple consecutive or adjacent flexible circuits 144 may be omitted.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. An apparatus comprising:
   a print head;
   a flexible circuit comprising:
   a flexible substrate;
   a first sprocket opening through the flexible substrate; and
   a first electrically conductive line on the flexible substrate and connected to the print head.

2. The apparatus of claim 1, wherein the first electrically conductive line extends adjacent an edge of the first sprocket opening.

3. The apparatus of claim 1, wherein the first electrically conductive line encircles the first sprocket opening.

4. The apparatus of claim 1 further comprising a first contact pad on the flexible substrate, wherein the first electrically conductive line is electrically connected to the contact pad.

5. The apparatus of claim 1 further comprising a window through the flexible substrate, wherein the print head is exposed through the window.

6. The apparatus of claim 1 further comprising:
   a second sprocket opening through the flexible substrate;
   a second electrically conductive line on the flexible substrate adjacent an edge of the second sprocket opening and connected to the print head.

7. The apparatus of claim 6 further comprising:
   a first contact pad electrically connected to the first electrically conductive line; and
   a second contact pad electrically connected to the second electrically conductive line, wherein the first electrically conductive line is electrically isolated from the second electrically conductive line.

8. The apparatus of claim 1, wherein the first electrically conductive line comprises a first metallic layer and a second metallic layer electroplated on the first metallic layer.

9. The apparatus of claim 8, wherein the first layer comprises copper and wherein the second layer comprises gold.

10. The apparatus of claim 1, wherein the flexible substrate has a longitudinal length greater than a transverse width, wherein the first sprocket opening is on a first longitudinal end of the flexible substrate and wherein the flexible circuit further comprises a second sprocket opening through the flexible substrate on a second longitudinal end of the flexible substrate.

11. The apparatus of claim 10, wherein the first sprocket opening and the second sprocket opening have a center-to-center spacing selected from a group of spacings consisting of 25 mm, 48 mm and 70 mm.

12. The apparatus of claim 10 further comprising a window through the flexible substrate and through which the print head is exposed, wherein the first sprocket opening is longitudinally spaced from an edge of the window by less than or equal to 3 mm.

13. The apparatus of claim 10, wherein the first sprocket opening is proximate a first longitudinal end of the flexible substrate and distant a second longitudinal end of the flexible substrate and wherein the flexible circuit further comprises a second electrically conductive line electrically isolated from the first electrically conductive line, the first electrically conductive line and the second electrically conductive line each being sandwiched between the first sprocket opening and the first longitudinal end of the flexible substrate.

14. The apparatus of claim 10, wherein all electrically conductive lines of the flexible circuit, including the first electrically conductive line, are longitudinally spaced from a first longitudinal end of the flexible substrate.

15. The apparatus of claim 10, wherein the flexible circuit further comprises:
   a contact pad on the flexible substrate;
   a second electrically conductive line on the flexible substrate and electrically connected to the contact pad, wherein the second electrically conductive line terminates at a transverse end of the flexible substrate.

16. An apparatus comprising:
   a flexible circuit comprising:
   a flexible substrate having a launched a length greater than a transverse width;
   a first sprocket opening through the flexible substrate $21^{st}$ longitudinal end of the flexible substrate; and
   a second sprocket opening through the flexible substrate on a second longitudinal end of the flexible substrate.

17. The apparatus of claim 16 further comprising an electric conductive line encircling the sprocket opening.

18. The apparatus of claim 16, wherein the first sprocket opening is proximate a first longitudinal end of the flexible substrate and distant a second longitudinal end of the flexible substrate and wherein the flexible circuit further comprises a first electric conductive line and a second electrically conductive line electrically isolated from the first electrically conductive line, the first electrically conductive line and the second electrically conductive line each being sandwiched between the first sprocket opening and the first longitudinal end of the flexible substrate.

19. The apparatus of claim 16 further comprising a window through the flexible substrate to receive a print head.

20. An apparatus comprising:
   a flexible circuit comprising:

a flexible substrate;
a sprocket opening through the flexible substrate; and
an electrically conductive line encircling the sprocket opening.

* * * * *